(12) United States Patent
Wangler et al.

(10) Patent No.: US 6,597,511 B2
(45) Date of Patent: Jul. 22, 2003

(54) MICROLITHOGRAPHIC ILLUMINATING SYSTEM AND MICROLITHOGRAPHIC PROJECTION EXPOSURE ARRANGEMENT INCORPORATING SAID SYSTEM

(75) Inventors: Johannes Wangler, Königsbronn (DE); Jess Köhler, Oberkochen (DE)

(73) Assignee: Carl-Zeiss-Stiftung, Heidenheim-Brenz (DE)

(*) Notice: Subject to any disclaimer, the term of this patent is extended or adjusted under 35 U.S.C. 154(b) by 60 days.

(21) Appl. No.: 09/820,625

(22) Filed: Mar. 30, 2001

(65) Prior Publication Data
US 2001/0043408 A1 Nov. 22, 2001

(30) Foreign Application Priority Data
Mar. 31, 2000 (DE) .......................... 100 16 176

(51) Int. Cl.⁷ ................................ G02B 3/00
(52) U.S. Cl. ................. 359/649; 359/656; 362/268
(58) Field of Search ............... 359/649–651, 359/656–661, 726, 831–837; 362/268, 331; 355/53, 67

(56) References Cited

U.S. PATENT DOCUMENTS

| 4,701,035 A | 10/1987 | Hirose | 359/366 |
| 5,418,583 A * | 5/1995 | Masumoto | 353/38 |
| 5,991,088 A * | 11/1999 | Mizouchi | 359/649 |
| 6,366,410 B1 * | 4/2002 | Schultz et al. | 359/649 |
| 6,392,822 B1 * | 5/2002 | Takahashi | 359/728 |

FOREIGN PATENT DOCUMENTS

| EP | 0779528 | 6/1997 |
| EP | 0964282 | 12/1999 |
| JP | 10-204428 | 1/2000 |

OTHER PUBLICATIONS

U.S. patent application Ser. No. 09/125,621, filed Dec. 3, 1997.

U.S. patent application Ser. No. 09/449,415, filed Nov. 29, 1999.

* cited by examiner

Primary Examiner—Jordan M. Schwartz
(74) Attorney, Agent, or Firm—Walter Ottesen

(57) ABSTRACT

A microlithographic projection exposure arrangement has an off-axis field and has a catoptric or catadioptric projection objective (P). In this arrangement, the illumination system (ILL) is made as small as possible in that a lateral offset ($\Delta y$) of the optical axes (OAI, OAP) is introduced relative to each other. A corrective element (AE) is arranged off-axis and functions to adapt the telecentry.

24 Claims, 3 Drawing Sheets

MICROLITHOGRAPHIC ILLUMINATING SYSTEM AND MICROLITHOGRAPHIC PROJECTION EXPOSURE ARRANGEMENT INCORPORATING SAID SYSTEM

FIELD OF THE INVENTION

The invention relates to a microlithographic illuminating system having an optical axis and optical elements arranged symmetrically with respect thereto as well as an image field plane. The invention also relates to a microlithographic projection exposure arrangement.

BACKGROUND OF THE INVENTION

Illuminating systems and projection exposure arrangements of the above kind are described, for example, in U.S. Pat. No. 6,243,206.

Such an illumination system is also known from U.S. Pat. No. 6,466,303. The illuminating system and projection objective have a common optical axis indicated by reference character A in FIG. 1 of this publication.

Objectives with mirrors cannot simultaneously have unvignetted field and image planes centered about the optical axis (except when using a beam splitter). For this reason, for example, in U.S. Pat. No. 6,466,303, the object and image field is a rectangle lying outside of the optical axis. The illuminating field, which is generated by the axially-symmetrical illuminating system, includes this off-axis rectangle as shown in FIG. 2 of U.S. Pat. No. 6,466,303.

This circularly-shaped field is significantly larger than a minimum circularly-shaped field which centrally includes the rectangle. The same applies to object and image fields formed as annular segments. These object and image fields are also used in microlithography.

The sizes of the lenses and mirrors of an optical system increase with the field. For this reason, the image errors and the complexity of correction also increase.

In high-power VUV optics, such as for the microlithography at 193 nm or 157 nm excimer lasers, the availability of the optical materials (quartz glass and fluoride single crystals) and the high material cost together with increasing lens diameter become more problematic.

SUMMARY OF THE INVENTION

In view of the above, it is an object of the invention to provide an illuminating system which can supply projection objectives having an off-axis field with minimum lens diameters.

If one simply takes an axial-symmetrical illuminating system the optical axis of which centers to the off-axis field of the projection objective but is displaced parallelly to the optical axis thereof, then the following problem occurs.

The imaging errors of optical systems comprising axial-symmetric elements are axially symmetric. If the optical axes of an illuminating system and a projection objective are, however, displaced parallelly to each other in favor of the small illuminating system, then the errors of the two are not of the same symmetry and can therefore not be mutually compensated. For microlithographic projection exposure arrangements, the telecentric error is especially critical.

According to a feature of the invention, the illuminating system and the projection objective are adapted to each other in the symmetry of their respective image error distribution in the reticle plane notwithstanding the axis offset.

A mutual tilting is, in principle, not sufficient.

In the objective, an element, which is not rotationally symmetric to the optical axis, would perforce have influence on the structure transfer whose quality is, however, primary.

The microlithographic illuminating system of the invention defines an optical axis and includes: a light source for supplying and transmitting a light beam along the optical axis; a plurality of optical elements arranged along the optical axis downstream of the light source for conducting the light beam on a beam path along the optical axis and for defining a field; and, one of the optical elements being arranged close to the field for intercepting all of the light beam and being configured so as to be asymmetrical with respect to the optical axis.

The object of the invention achieved with an optical element which is mounted close to the field in the illuminating system as described above and which element is configured asymmetrical to the optical axis. This element is different from an off-axis raster element (as it is used, for example, in honeycomb condensers of illuminating systems) in that, in the element of the invention, the total beam is detected by a single continuously differentiable cross-sectional area. Such elements are especially lenses, prisms, plates and mirrors all with aspheric surfaces of a rotational symmetrical nature as well as free-formed surfaces. Equivalents are like-functioning Fresnel lenses, binary or stepped optical elements and diffractive elements, also in combination.

According to one embodiment of the invention, the asymmetrical optical element is arranged next to the image plane of the illuminating system or to a field plane equivalent thereto.

Based on function, the correction element (asymmetrically configured optical element) would lie optimally precisely in the reticle plane. The optical elements of the illuminating system, however, have to exhibit a practical working distance to the reticle. General requirements of the optical design are also to be considered which can lead to an arrangement of the asymmetrical refractive optical element at deviating locations but not close to the aperture.

Preferred embodiments of the invention provide for a decentered spherical or rotational symmetrical aspheric lens, for example, a toric lens or a wedge plate (prism) as well as a free-form corrective surface (general asphere) in combination with the above-mentioned forms or independent therefrom.

Known centering lenses are decentered in the adjustment of optical systems in the micrometer range in order to bring the assembled system with manufacturing tolerances close to the constructed ideal axially-symmetrical desired system. In contrast to these known centering lenses, comparatively large decenterings of over 1 mm are preferred in accordance with the invention.

According to another feature of the invention, the asymmetrical or decentered element is mounted close to the field in a REMA objective, preferably as the first or last lens of this REMA objective with the REMA objective defining the end of the illuminating system.

According to another feature of the invention, the illuminating system is telecentric with a defined deviation and therefore the illuminating system is adapted to a corresponding projection objective.

The combination of such an illuminating system and the additional conventional systems results in a projection exposure arrangement according to an embodiment of the invention. The number of the system components is not fixed and not limited to the optical core assemblies.

In addition to catoptric objectives, preferably catadioptric projection objectives can be used in accordance with a feature of the invention. Preferred embodiments of the catadioptric objectives are those having precisely one concave mirror and at least two folding mirrors, such as described in U.S. Pat. No. 6,466,303, or embodiments without folding mirrors with a through symmetrical axis of all optical elements. Thus, the projection objective has a symmetrical axis to which the optically effective surfaces of all optical elements are rotationally symmetrical with respect to surface curvature except for production deviations in the individual case.

Suitable objectives, namely catoptric or catadioptric objectives derived therefrom, having a plurality of curved mirrors are known, for example, from U.S. Pat. No. 5,815,310 or U.S. Pat. No. 4,701,035.

According to another feature of the invention, the optical axis of the illuminating system and the optical axis of the projection objective exhibit a parallel offset. According to still another feature of the invention, the image and object circles, which are coincident on the reticle, are of different sizes and the image field of the illuminating system is smaller. The image and object circles include the object field which is to be transmitted. In this way, all advantages are provided in the manufacture of illuminating systems.

According to another feature of the invention, the projection objective is telecentric at the object side with a maximum deviation of the chief ray angles of 0.1 to 50 mrad from the parallel to the optical axis via the object field utilized. Thus, this feature gives the object side telecentry of the projection objective for the appropriate telecentry of the illuminating system. This system is telecentric in the image field plane with a maximum deviation of the chief ray angle of 0.1 to 50 mrad and it is preferable to use this for the invention.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
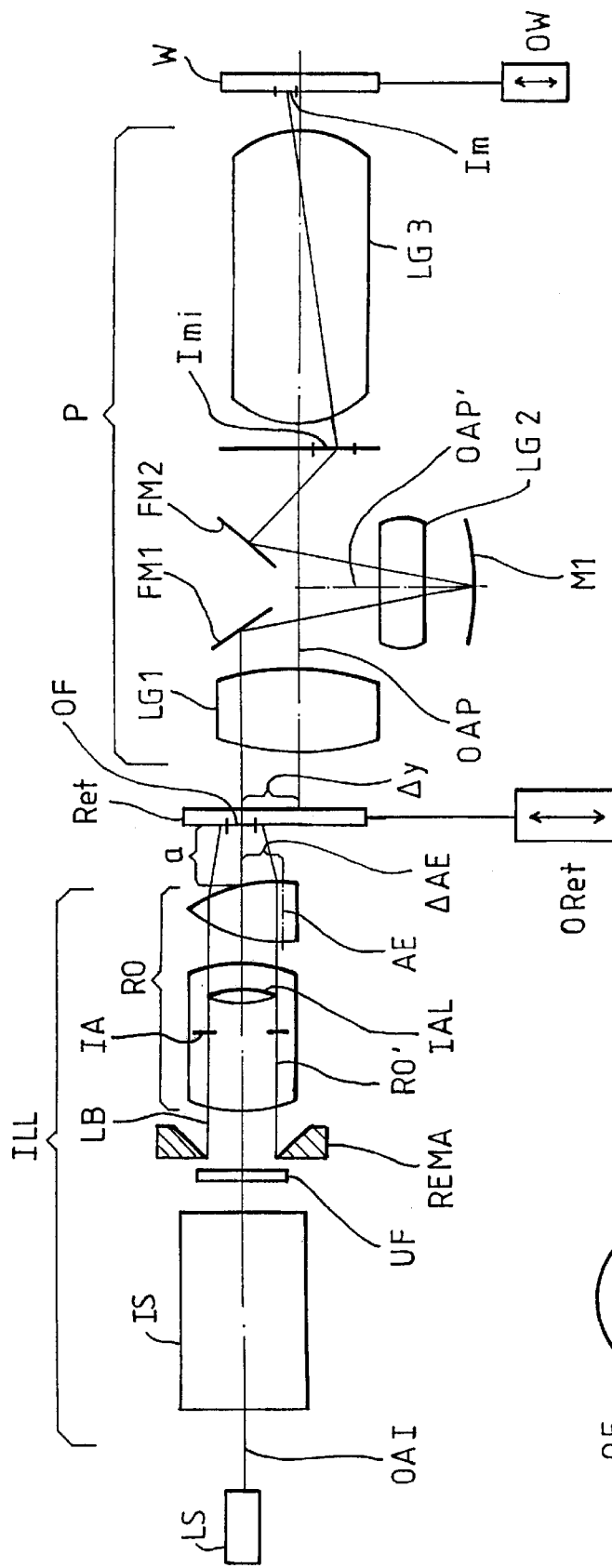
FIG. 1 is a schematic lens section view of the projection exposure arrangement according to the invention.

The lens section view of FIG. 1 shows an example of an embodiment of the projection exposure arrangement of the invention wherein the light source LS is normally an excimer laser, for example, at 193 nm or at 157 nm wavelength. The light source LS can also be another available light source at an ultraviolet wavelength. With this light source LS, the illuminating system ILL is arranged centered to the optical axis OAI. This optical axis OAI is usually angled with folding mirrors in order to make possible an entire machine having practical dimensions and high stability.

A subsystem IS of the illuminating system ILL functions for ray formation, increase of the geometrical light flux or increase of the etendue, adjustment of the nature of illumination (conventional, ring aperture, dipole, quadrupole) and degree of coherence and the homogenization.

A reticle masking system REMA is mounted in a field plane and limits the field OF illuminated on the reticle Ret. This limiting can be adjustable if required.

A uniformity filter UF can be mounted in the vicinity and ensures the uniformity of the illumination intensity in the reticle plane Ret. The uniformity filter can be made available as an absorption graduated filter by vaporization of a metal layer on a planar plate.

The downstream REMA objective RO functions to provide edge-sharp imaging of the field, which is delimited by the reticle mask REMA, on the reticle plane or on the reticle Ret. The REMA objective RO comprises a part RO' of lenses, which are centered to the optical axis OAI, and a field-near adaptation element AE asymmetrical to the optical axis OAI. The adaptation element AE is adjacent the reticle plane Ret at a spacing (a). At least one lens IAL is mounted between the aperture plane IA and the adaptation element AE. The adaptation element AE has an offset ΔA relative to the optical axis OAI. The light beam LB is shown schematically in the region of the REMA objective. The light beam LB passes through the asymmetrical adaptation element AE, that is, through its continuously differentiable optical boundary surfaces. The arrangement is therefore not comparable to a lens array as it is used in a honeycomb condenser and wherein a plurality of lenses is mounted one next to the other also next to the optical axis.

The reticle Ret is in the reticle plane and carries the mask of the structure to be imaged and the reticle is held via a positioning and moving system ORet.

The projection objective P is mounted downstream and is here a catadioptric system having concave mirror M1, two folding mirrors FM1 and FM2 and the lens groups LG1, LG2 and LG3. The optical axis OAP of the projection system P is deflected to the ancillary axis OAP' between the folding mirrors FM1, FM2. Object field OF, intermediate image Imi and image Im on the wafer W are each laterally offset relative to the optical axis OAP of the projection objective P. The wafer W is arranged in the image plane and is positioned and moved by the operating system OW. In object field OF, the offset has the value Δy and is required so that the light beams, which go back and forth in the region of the concave mirror M1 and the lens group LG2, can be separated by the folding mirrors FM1 and FM2.

The arrangement of the projection exposure arrangement and numerous variations thereof are known per se, for example, from the above-mentioned publications.

What is special here is the parallel offset of the optical axes OAI of the illuminating system ILL and OAP of the projection objective P on the reticle plane Ret and the adaptation element AE in the illuminating system ILL.

Figure 2:
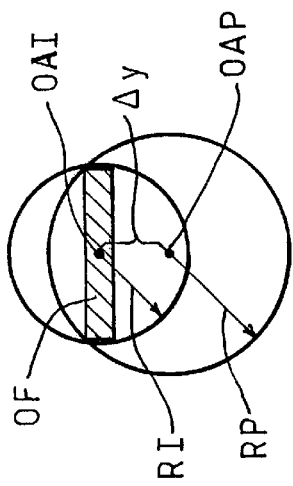
FIG. 2 is a schematic showing a cross section of the arrangement of FIG. 1 taken through the reticle plane.

FIG. 2 is a section through the reticle plane Ret which displays the effect obtained with the foregoing.

The narrow rectangular object field OF of, for example, 35×110 $mm^2$ (adapted for a wafer scanner having a 1:5 projection objective P), is offset by the value Δy relative to the optical axis OAP of the projection objective P. The object field OF is inscribed in a circle about the optical axis OAP with the circle having the radius RP and the object field touching the edges of the circle. This circle defines the object field of the projection objective P which, however, cannot be used better for the reasons mentioned above. The object field is relevant for the imaging geometry and the imaging error.

The same circle having radius RP is conventionally the image field of the illuminating system. In this context, reference can be made to U.S. Pat. No. 6,466,303.

For the above, the REMA objective must have the necessary structural size and the corresponding structural complexity.

According to the invention, however, the illuminating system ILL has the smaller image field having the radius RI which encloses precisely the rectangle OF, that is, the object field OF used by the projection objective P. The rectangle OF arises from the imaging of the REMA system. The center of the rectangle OF lies on the optical axis OAI of the illuminating system ILL and is precisely shifted by the offset Δy of the object field OF relative to the optical axis OAP of the projection objective P.

Of course, in a compromise, also another lateral offset of the two optical axes OAI and OAP can be selected. Then, however, the reduction of the image field of the illuminating system ILL is not optimal.

Figure 3:
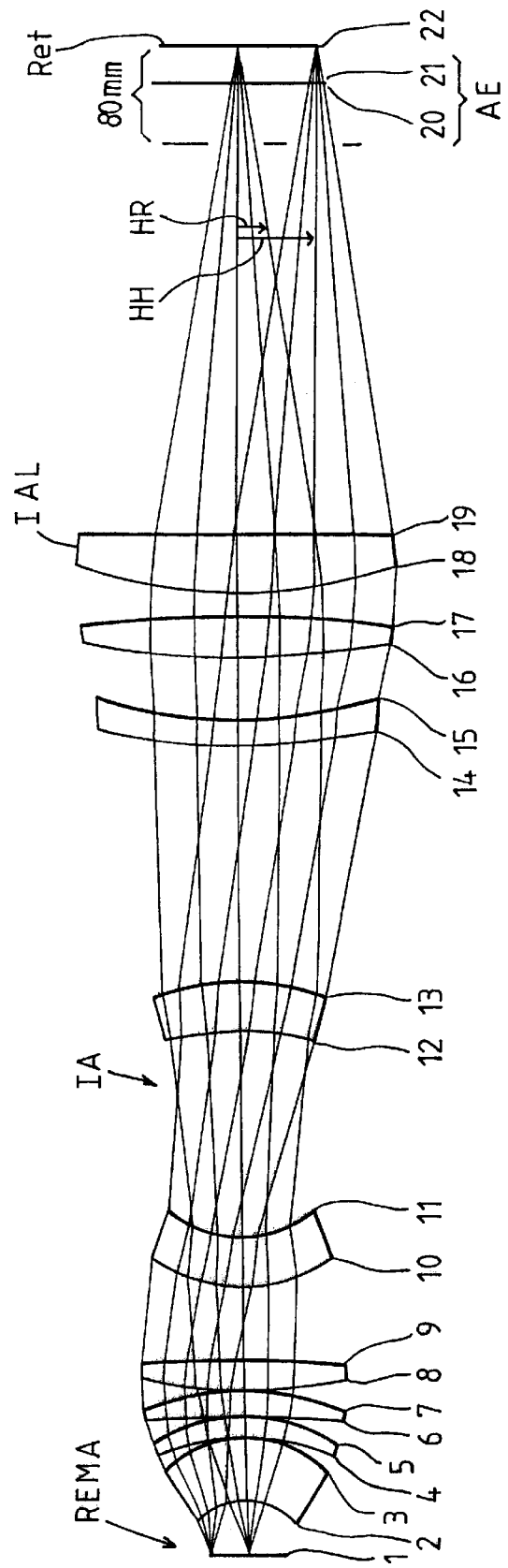
FIG. 3 is a lens section view of a REMA objective.
Figure 4:
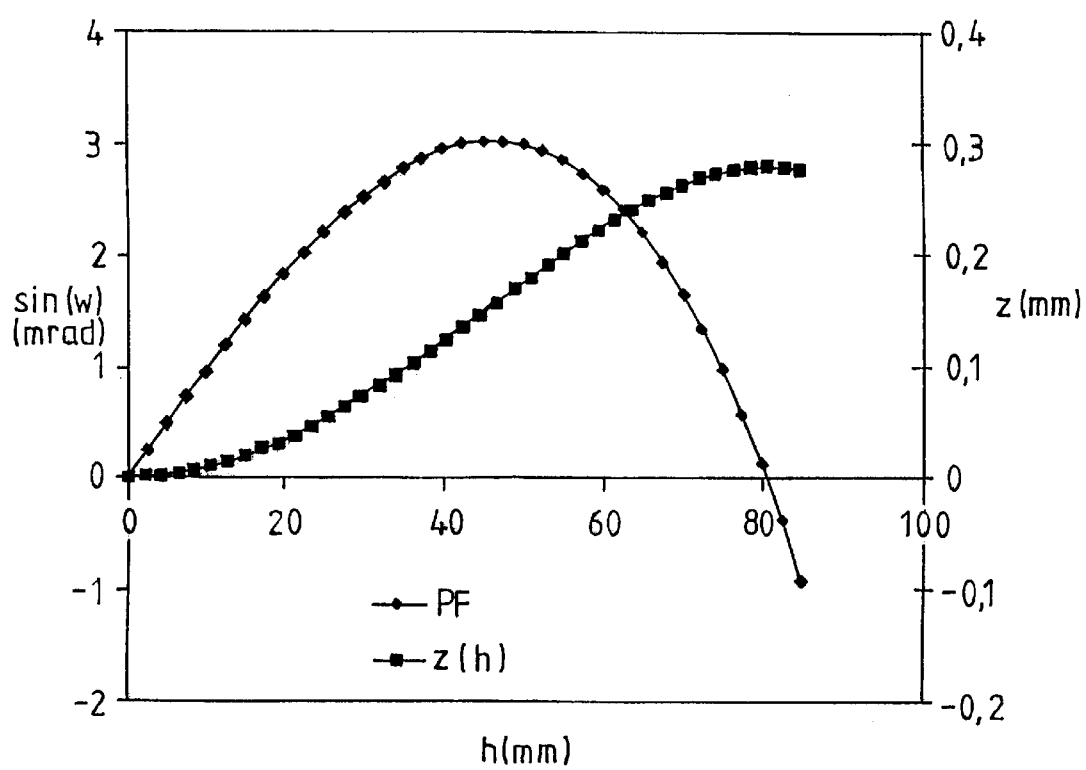
FIG. 4 is a graph showing a pupil function of a projection objective and the radial elevation profile of a correction asphere (asymmetrical adaptation element).

A specific embodiment of a REMA objective RO with an adaptive element AE is described with respect to FIGS. 3 and 4.

A highly developed projection objective P of microlithography is telecentric at both sides. To optimize the imaging characteristics, small disturbances of the pupil (deformation of the aperture plane) and therefore an object side deviation of the telecentry is permitted. This becomes manifest in a deviation of the chief ray angles of approximately 0.1 to 50 mrad from the parallel to the optical axis OAP. The deviation changes with object height and is rotational symmetrical to the optical axis OAP.

This pupil function or deviation from the telecentry can be compensated by the illuminating system ILL and especially by the REMA objective RO. This is described, for example, in U.S. Pat. No. 6,366,410, and incorporated herein by reference.

The REMA objective RO is shown in FIG. 3 and has an imaging scale of −2.0. The REMA objective RO has an image field radius of RI=57.7 mm and is so suitable for a scanner having an image field of 7×22 mm$^2$ with a demagnification of 1:5. Table 1 presents the construction data of this REMA objective RO. The quantities "the height HR of the aperture peripheral ray of the center beam" and "the height HH of the chief ray of the field peripheral beam" are shown in FIG. 3 as exemplary. These quantities are given for the data of the scale for the field nearness of the adaptation element AE. In the field planes defined by the reticle Ret and the reticle mask REMA, HR becomes equal to 0 and, in the aperture plane IA, HH becomes equal to 0. In the position of the adaptation element AE selected in this example, all rays of the field peripheral beam have a greater height than all rays of the center beam.

Reference character IAL identifies a lens element between the aperture plane IA and the adaptation element AE. The lens element is centered relative to the optical axis OAI and the aperture plane IA is Fourier transformed to the image field.

FIG. 4 shows a typical pupil function PF of a projection objective P to which the REMA objective shown above is adapted. Deviations in the range of a few milliradians result compared to the ideal parallel trace of the chief rays. The trace is, however, not homocentric, that is, the angle does not increase proportional to the chief ray height but shows a non-linear trace with positive and negative deviations.

The adaptation element AE (corrective asphere) can compensate precisely this trace of the pupil function with the arrow height profile z(h) shown in FIG. 4. Table 2 presents the precise data of this arrow height profile z(h).

The minimum thickness of the adaptation element AE is 1 mm and the surface (20 in Table 1) facing away from the reticle Ret is planar. This element AE is asymmetrical in such a manner to the optical axis OAI that it is centered to the optical axis OAP of the projection objective P. The element AE is therefore offset by ΔAE=Δy=42.0 mm relative to the optical axis OAI of the REMA objective RO. The magnitude of the offset is favorable but not absolutely necessary; rather, this magnitude of the offset can be optimized depending upon additional parameters.

Constructively, the adaptation element AE is cropped corresponding to its illumination by the light bundle IAL rotationally symmetric about the axis OAI whereby the adaptation element can be easily accommodated in a conventional cylindrical holder of the REMA objective RO.

The residual error of the pupil function of the illuminating system ILL compared to the pupil function of the projection objective P therefore amounts to ±0.2 mrad in the utilized rectangular object field OF. A reduction by one order of magnitude is therefore achieved.

The disturbances of the adaptation element AE' on other quality features of the REMA objective OR' are minimal because it is close to a field plane. The uniformity of the illumination over the utilized object field OF is changed by less than 1.5% and is independent of the illuminating aperture. This can be still further improved by an adapted uniformity filter (UF in FIG. 1). The sharpness of the edge imaging of the REMA diaphragm remains within the tolerance of 300 μm. As required, it is possible to utilize additional corrective means and to utilize adjustment technology including tilting and decentering of lenses or lens groups by minimal amounts for optimization.

A spherical corrective surface would be adequate in a purely homocentric entry pupil.

The spacing of the adaptation element AE to the reticle plane Ret is a compromise between the largest possible free working distance for good manipulation of the reticle Ret and the optimal pure effect of the adaptation element on the chief ray angle distribution in the image field at minimum spacing. An upper limit for this spacing is at 80 mm.

It is understood that the foregoing description is that of the preferred embodiments of the invention and that various changes and modifications may be made thereto without departing from the spirit and scope of the invention as defined in the appended claims.

TABLE 1

Surface number, radius of curvature and thickness of the REMA objective (imaging scale β = −2)
Wavelength: λ = 157.63 nm; lens material: calcium fluoride
Aperture: NA' = 0.15

| No. | r (mm) | d (mm) | |
| --- | --- | --- | --- |
| 1 | ∞ | 44.1466 | REMA |
| 2 | — 46.2216 | 49.9488 | |
| 3 | — 82.3304 | 0.5706 | |
| 4 | — 166.6123 | 17.5396 | |
| 5 | — 116.4438 | 0.5545 | |
| 6 | — 699.5416 | 19.8220 | |
| 7 | — 200.1951 | 0.8749 | |
| 8 | 309.4913 | 23.5149 | |
| 9 | — 1273.1979 | 57.3418 | |
| 10 | 104.5163 | 39.8319 | |
| 11 | 80.0414 | 163.4516 | |
| 12 | — 205.4711 | 39.9773 | |
| 13 | — 152.3686 | 187.0236 | |
| 14 | 409.6726 | 20.2073 | |
| 15 | 293.7478 | 49.9905 | |
| 16 | 572.9306 | 32.3789 | |

TABLE 1-continued

Surface number, radius of curvature and thickness of the
REMA objective (imaging scale β = −2)
Wavelength: λ = 157.63 nm; lens material: calcium fluoride
Aperture: NA' = 0.15

| No. | r (mm) | d (mm) | |
|---|---|---|---|
| 17 | — | 897.2471 | 18.3879 |
| 18 | | 334.4892 | 45.8774 |
| 19 | | 36393.5512 | 357.6868 |
| 20 | | ∞ | 1.0000 | AE' asymmetric element |
| 21 | | ∞ | 30.0000 | |
| 22 | | ∞ | | Ret |

TABLE 2

Arrow height z of the asymmetrically arranged refractive
element AE' as a function of the distance h from the optical
axis OAP of the projection objective P, center
thickness 1.0000 mm

| h (mm) | z (mm) |
|---|---|
| 2.500 | 0.00060 |
| 5.000 | 0.00225 |
| 7.500 | 0.00495 |
| 10.000 | 0.00869 |
| 12.500 | 0.01343 |
| 15.000 | 0.01921 |
| 17.500 | 0.02601 |
| 20.000 | 0.03372 |
| 22.500 | 0.04229 |
| 25.000 | 0.05168 |
| 27.500 | 0.06182 |
| 30.000 | 0.07270 |
| 32.500 | 0.08422 |
| 35.000 | 0.09629 |
| 37.500 | 0.10880 |
| 40.000 | 0.12168 |
| 42.500 | 0.13485 |
| 45.000 | 0.14820 |
| 47.500 | 0.16162 |
| 50.000 | 0.17498 |
| 52.500 | 0.18816 |
| 55.000 | 0.20107 |
| 57.500 | 0.21353 |
| 60.000 | 0.22538 |
| 62.500 | 0.23651 |
| 65.000 | 0.24679 |
| 67.500 | 0.25605 |
| 70.000 | 0.26416 |
| 72.500 | 0.27082 |
| 75.000 | 0.27589 |
| 77.500 | 0.27927 |
| 80.000 | 0.28078 |
| 82.500 | 0.28024 |
| 85.000 | 0.27758 |

What is claimed is:

1. A microlithographic illuminating system (ILL) defining an optical axis (OAI) and comprising:

a light source for supplying and transmitting a light beam (LB) along said optical axis (OAI);

a plurality of optical elements arranged along said optical axis downstream of said light source for conducting said light beam on a beam path along said optical axis and for defining a field;

one of said optical elements (AE) being arranged at a location in the beam path whereat the height (HH) of the chief ray of the field peripheral beam is greater than the height (HR) of the aperture peripheral ray of the center beam for intercepting all of said light beam (LB) and being configured so as to be asymmetrical with respect to said optical axis; and, said one optical element (AE) having a continuously differentiable surface.

2. The microlithographic system of claim 1, wherein said plurality of elements define an image field plane (Ret) in said field; and, said one optical element (AE) being arranged next to said image field plane (Ret) or next to a plane conjugated therewith.

3. The microlithographic system of claim 2, wherein the distance (a) of said one element (AE) from said image field plane (Ret) is less than 80 mm.

4. The microlithographic system of claim 3, wherein the image field has a diameter (2RI) and the distance (a) of said one optical element (AE) from said image field plane (Ret) is less than 69% of said diameter (2RI) of said image field.

5. The microlithographic system of claim 4, wherein said optical elements define a plane (IA) Fourier transformed to said image field and a second one of said optical elements is a centered optical element mounted between said one optical element (AE) and said plane (IA).

6. The microlithographic system of claim 1, wherein said one element (AE) is at a location in the beam path whereat the height (HH) of the chief ray of the field peripheral beam is twice the height (HR) of the aperture peripheral ray of the center beam.

7. The microlithographic system of claim 1, wherein said one element (AE) is a decentered spherical lens having a decentering (ΔAE) of greater than 1 mm.

8. The microlithographic system of claim 1, wherein said one element (AE) is a decentered rotational symmetric aspheric lens having a decentering (ΔAE) of greater than 1 mm.

9. The microlithographic system of claim 1, wherein said one element (AE) is a wedge plate.

10. The microlithographic system of claim 1, wherein said one element (AE) has a free-form corrective surface.

11. The microlithographic system of claim 1, wherein said plurality of elements defines a REMA objective (RO); and, wherein said system further comprises: a reticle mask (REMA) mounted upstream of said one element (AE); and, said one element (AE) is mounted in said REMA objective (RO) next to the object field at said reticle mask (REMA) or next to the image field at the microlithographic mask (Ret).

12. The microlithographic system of claim 11, wherein said one element (AE) is the first or the last element of said REMA objective (RO).

13. The microlithographic system of claim 1, wherein said system is telecentric in the image field plane (Ret) with a maximum deviation of the chief ray angle of from 0.1 to 50 mrad.

14. A microlithographic projection exposure system comprising:

an illuminating system (ILL) defining a first optical axis (OAI) and including:

a light source for supplying and transmitting a light beam (LB) along said first optical axis (OAI);

a plurality of optical elements arranged along said first optical axis downstream of said light source for conducting said light beam on a beam path along said first optical axis and for defining a field;

one of said optical elements (AE) being arranged at a location in the beam path whereat the height (HH) of the chief ray of the field peripheral beam is greater than the height (HR) of the aperture peripheral ray of the center beam for intercepting all of said light beam (LB) and being configured so as to be asymmetrical with respect to said first optical axis; and, said one optical element (AE) having a continuously differentiable surface;

a reticle positioning and moving system (Oret);

a projection objective (P) downstream of said illuminating system and defining a second optical axis (OAP);

an object field (OF) decentered with respect to said second optical axis (OAB); and, a wafer positioning and moving system (OW).

15. The microlithographic projection exposure system of claim 14, wherein said projection objective (P) is a catadioptric objective.

16. The microlithographic projection exposure system of claim 14, wherein said projection objective (P) includes precisely one concave mirror (MI) and at least two folding mirrors (FM1, FM2).

17. The microlithographic projection exposure system of claim 14, wherein said second optical axis (OAP) of said projection objective (P) is a symmetrical axis; and, said projection objective (P) includes a plurality of optical elements, all of them having optically effective surfaces which are rotationally symmetric in their surface curvature with respect to said second optical axis except for production deviations in the individual case.

18. The microlithographic projection exposure system of claim 14, wherein said first optical axis (OAI) and said second optical axis (OAP) are offset with respect to each other by a parallel offset ($\Delta y$).

19. The microlithographic projection exposure system of claim 14, wherein the image circular radius (RI) of said illuminating system (ILL) is less than the object circular radius (RP) of said projection objective (P).

20. The microlithographic projection exposure system of claim 14, wherein said projection objective (P) is telecentric at the object side thereof and has a maximum deviation of the chief ray angle of 0.1 to 50 mrad from the parallels to said second optical axis (OAP) over the utilized object field (OF).

21. A microlithographic illuminating system (ILL) defining an optical axis (OAI) and comprising:

a light source for supplying and transmitting a light beam (LB) along said optical axis (OAI);

a plurality of optical elements arranged along said optical axis downstream of said light source for conducting said light beam on a beam path along said optical axis and for defining a field;

one of said optical elements (AE) being arranged at a location in the beam path whereat the height (HH) of the chief ray of the field peripheral beam is greater than the height (HR) of the aperture peripheral ray of the center beam for intercepting all of said light beam (LB) and being configured so as to be asymmetrical with respect to said optical axis;

said plurality of elements defining an image field plane (Ret) in said field;

said one optical element (AE) being arranged next to said image field plane (Ret) or next to a plane conjugated therewith;

the distance (a) of said one element (AE) from said image field plane (Ret) being less than 80 mm; and, the image field having a diameter (2RI) and the distance (a) of said one optical element (AE) from said image field plane (Ret) being less than 69% of said diameter (2RI) of said image field.

22. The microlithographic system of claim 21, wherein said optical elements define a plane (IA) Fourier transformed to said image field and a second one of said optical elements is a centered optical element mounted between said one optical element (AE) and said plane (IA).

23. A microlithographic illuminating system (ILL) defining an optical axis (OAI) and comprising:

a light source for supplying and transmitting a light beam (LB) along said optical axis (OAI);

a plurality of optical elements arranged along said optical axis downstream of said light source for conducting said light beam on a beam path along said optical axis and for defining a field;

one of said optical elements (AE) being arranged at a location in the beam path whereat the height (HH) of the chief ray of the field peripheral beam is greater than the height (HR) of the aperture peripheral ray of the center beam for intercepting all of said light beam (LB) and being configured so as to be asymmetrical with respect to said optical axis; and, said one element (AE) being at a location in the beam path whereat the height (HH) of the chief ray of the field peripheral beam is twice the height (HR) of the aperture peripheral ray of the center beam.

24. A microlithographic illuminating system (ILL) defining an optical axis (OAI) and comprising:

a light source for supplying and transmitting a light beam (LB) along said optical axis (OAI);

a plurality of optical elements arranged along said optical axis downstream of said light source for conducting said light beam on a beam path along said optical axis and for defining a field;

one of said optical elements (AE) being arranged at a location in the beam path whereat the height (HH) of the chief ray of the field peripheral beam is greater than the height (HR) of the aperture peripheral ray of the center beam for intercepting all of said light beam (LB) and being configured so as to be asymmetrical with respect to said optical axis; and, said one element (AE) being a wedge plate.

* * * * *